United States Patent
Varadarajan

(10) Patent No.: US 6,642,861 B1
(45) Date of Patent: Nov. 4, 2003

(54) ARRANGEMENTS HAVING TERNARY-WEIGHTED PARAMETER STEPPING

(75) Inventor: Hemmige D. Varadarajan, Sunnyvale, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/132,323

(22) Filed: Apr. 26, 2002

(51) Int. Cl.[7] .................................................. H03M 5/16
(52) U.S. Cl. ........................................... 341/57; 370/212
(58) Field of Search ..................... 341/57, 122; 370/212

(56) References Cited

U.S. PATENT DOCUMENTS

| 4,494,228 A | * | 1/1985 | Gutleber ...................... 370/342 |
| 4,751,697 A | * | 6/1988 | Hunter et al. ................ 370/400 |
| 6,188,339 B1 | * | 2/2001 | Hasegawa .................... 341/101 |

* cited by examiner

*Primary Examiner*—Peguy Jeanpierre
(74) *Attorney, Agent, or Firm*—Antonelli, Terry, Stout & Kraus, LLP

(57) ABSTRACT

Ternary weighted arrangements, for example, arrangements (delay circuits, devices, systems) including a variable delay determined on a ternary basis for use in testing set-up and hold times of a latch.

33 Claims, 3 Drawing Sheets

FIG. 1 - RELATED ART
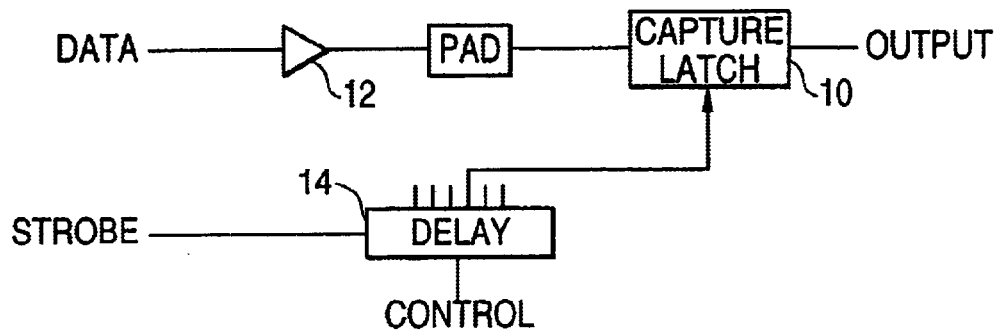
FIG. 2 - RELATED ART
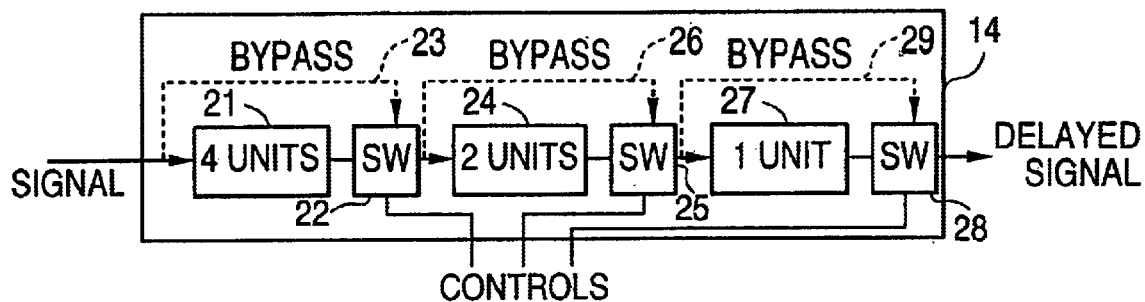
FIG. 5
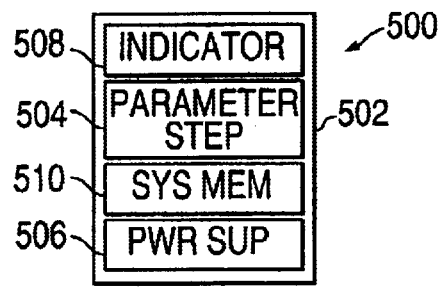

ARRANGEMENTS HAVING TERNARY-WEIGHTED PARAMETER STEPPING

FIELD

The present invention relates to ternary weighted arrangements. For example, it relates to arrangements (delay circuits, devices systems) including a variable delay determined on a ternary basis for use in testing set-up and hold times of a latch.

BACKGROUND

Background and example embodiments of the present invention will be described in the example context of providing variable or programmable delay between two signal paths relative to each other. However, it is stressed that both practice of embodiments of the present invention, and a scope of the appended claims, are not limited thereto.

Turning now to example background discussion, it is often necessary in electronic circuits to provide a delay of one signal in a path relative to another signal. This is especially true where it is necessary to test devices such as I/O latches within integrated circuits (ICs) so as to determine success of data capture. In this environment, it is desirable to test the exact limits on capture by sequentially changing the delay in order to determine a range (times) of successful data capture. This can be used, for example, to determine setup and hold times of a latch in input/output cells.

Various kinds of delay devices may be used for this purpose. One simple manner of doing this is to have a controlled delay block with selectable taps from various points in the block. The various taps have different values of delay. The selection of the desired delay can be accomplished, for example, by binary controls. As seen in FIG. 1, a latch 10 receives a data input from a driver 12 and a strobe input from a delay block 14. The delay block receives one or more control signals from a tester or other source which selects the particular delay tap, and hence the amount of delay imposed onto the strobe signal by the delay block. By changing the delay, it is possible to test and determine the range of delays at which the latch will successfully capture the data.

Another type of delay device which may be used involves a series of delay blocks having binary step values. That is, serially-connected blocks have delay values incrementing and decrementing according to powers of 2. Thus, as shown in FIG. 2, the first block 21 may have four ($2^2$) units of delay, the second block 24, two ($2^1$) units of delay, and the third block 27, one ($2^0$) unit of delay. Each block also may include a bypass 23, 26, 29 so that various values of delay units may be combined. Thus, the overall FIG. 2 arrangement has a delay block 14 that includes an input signal and an output delayed signal. One or more control signals, similar to that in FIG. 1, also selects the units which are bypassed. For example, the control signals may control a simple switching arrangement or multiplexer at each end of each bypass, so that the signal is either delayed by the block or bypasses it and is not delayed. Thus, the system can provide from 0 to 7 units of delay by bypassing one or more of the units. As examples, if all of units are bypassed, theoretically, 0 units of delay are provided. If none of units are bypassed, theoretically, 7 units of delay are provided.

The term "theoretically" is included in the above statements because it was recognized, for example, that even if all three bypasses were used in an attempt to match a zero strobe signal delay to a zero data signal delay, asymmetries may still exist between the parallel strobe and data signal paths, in that the switches 22, 25, 28 within the strobe path may introduce delay which is not within the data path.

Although both these systems are usable, they are not perfect, and it would be desirable to have a system which uses less hardware, less space on a chip and introduces fewer asymmetries, if possible.

BRIEF DESCRIPTION OF THE DRAWINGS

A better understanding of the present invention will become apparent from the following detailed description of example embodiments and the claims when read in connection with the accompanying drawings, all forming a part of the disclosure of this invention. While the following written and illustrated disclosure focuses on disclosing example embodiments of the invention, it should be clearly understood that the same is by way of illustration and example only, and that the invention is not limited thereto. The spirit and scope of the present invention are limited only by the terms of the appended claims.

The following represents brief descriptions of the drawings, wherein:

FIG. 1 is an example background disadvantageous arrangement useful in acquiring a better understanding of the invention;

FIG. 2 is another example background disadvantageous arrangement useful in acquiring a better standing of the invention;

FIG. 5 illustrates an example system including a variable stepping arrangement of the present invention.

DETAILED DESCRIPTION

Figure 3:
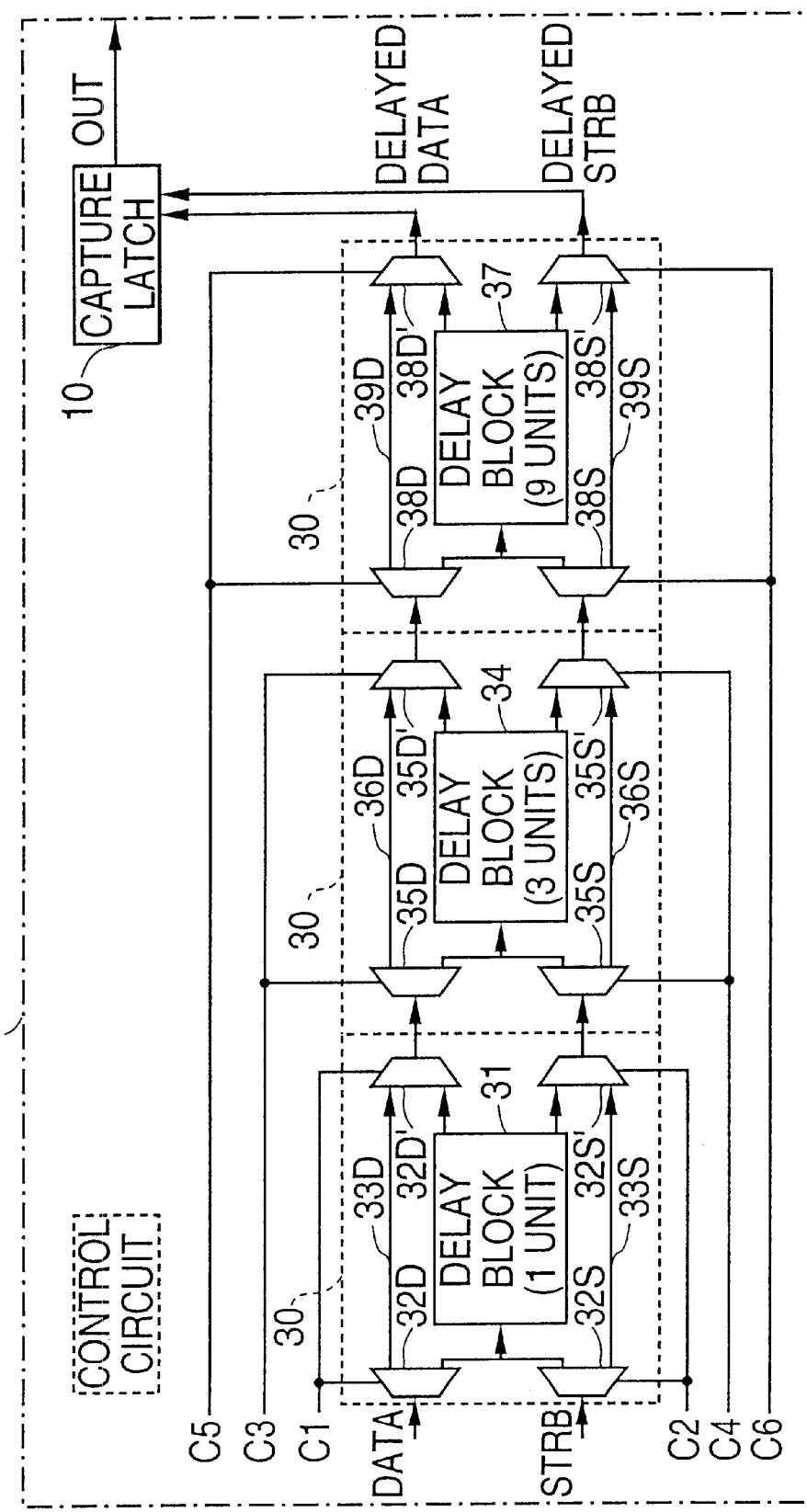
FIG. 3 is an example advantageous arrangement shown a first embodiment of the present invention.

Before beginning a detailed description of the subject invention, mention of the following is in order. When appropriate, like reference numerals and characters may be used to identify identical, corresponding or similar components in differing FIG. drawings. Further, in the detailed description to follow, examples sizes, ranges, values and models may be given, although the present invention is not limited thereto. With regard to the description of any timing signals, the terms assertion and negation may be used in an intended generic sense. Well-known ground and power connections to ICs and other components may not be shown within the figures for simplicity of illustration and discussion, and so as not to obscure the invention. Further, arrangements may be shown in block diagram form in order to avoid obscuring the invention and also in view of the fact that specifics with respect to implementation of such block diagram arrangements are highly dependent upon the platform within which the present invention is to be implemented and such specifics should be well within the purview of one skilled in the art. Where specific details are set forth to describe example embodiments of the invention, it should be apparent to one skilled in the art that the invention can be practiced with, or without variation of these specific details. Finally, it should be apparent that differing combinations of hard-wired circuitry and software instructions can be used to implement differing embodiments of the present invention so that the present invention is not limited to any specific combination of hardware and software.

As described above, one example use of such a delay circuit is in the measurement of a successful timing data capture range (window) of an input/output buffer on an IC chip. In this environment, it is necessary to vary the phase delay between the data signal and a strobe signal. At each different value of a phase difference, a latch is tested to see if it can successfully latch the data signal. As the phase varies, the pattern of successes and failures defines various characteristics of the buffer and whether it fulfills desired specifications. Because the variation in the phase is very small, it is also important that extraneous delay not be introduced into the system so that the only time difference is that which is deliberate. In the system of FIG. 2, the binary based delay blocks are only present in one of the signals, such as the strobe signal. However, in addition to the deliberate delay in the blocks, other components also may accidentally cause delays in one branch (e.g., the strobe path), while such delays are nonexistent in the other branch (e.g., the data path). This could include, for example, the switching devices 22, 25, 28 which allow the signal to bypass or enter the delay units. This type of unintentional delay can cause asymmetry, and thus, the measurement to be inaccurate, as well as limit the size of the time difference which can be measured.

FIG. 3 shows an example system according to one example embodiment of the present invention. This delay system may be used for a similar purpose as that described above, namely testing an input/output latch using a phase difference between the data and strobe signals. The capture latch 10 ultimately receives the data and strobe signals in a similar manner as in FIG. 1. However, the delay is introduced in this case using delay blocks 30 which have delay values incrementing or decrementing based on a ternary, or base three, system. Thus, the first delay block 31 includes only one unit of delay ($3^0$), the second block 34 includes three ($3^1$) units of delay, and the third block 37 includes nine ($3^2$) units of delay. If a larger delay is necessary, additional blocks can be added based on powers of three. Thus, the next block in the series would be twenty-seven ($3^3$) delay units.

It should be noted that it is possible to construct a range from zero to thirteen units of delay from the three blocks 20 as shown, as opposed to seven in the system of FIG. 2. That is, if the strobe signal is, for example, delayed by all three blocks, then nine+three+one=thirteen units of delay are provided. If all the blocks are bypassed, then zero units of delay are provided. Relatedly, one, three or nine units may be provided by using one of the three blocks, and four, ten or twelve units may be provided by combining two of the three blocks.

In order to obtain delays of two, five, six, seven, eight or eleven, it is not possible to merely add these units. Instead, it is necessary to subtract some of the units. This is accomplished by adding some of the delay to the other signal so that the desired difference is obtained. Thus, if it is desired to delay the strobe signal by two units in relation to the data signal, the strobe signal can be delayed by three and the data signal delayed by one. This provides a phase difference of three−one=two. Likewise, delays of five, six, seven, eight or eleven are possible by adding some delay to the strobe signal and some delay to the data signal. In this manner, all values of zero to thirteen are possible.

The following chart illustrates the example settings to achieve each value within the zero to thirteen range. As explanation, in order to delay the strobe signal in relation to the data signal by the amount indicated in the left-hand column, each of the ternary values at the top of the three columns should be applied to the strobe signal (indicated by S), applied to the data signal (indicated by D), or not applied to either (indicated by a blank).

| Delay | 1 | 3 | 9 | 0 + 0 + 0 = 0 |
|---|---|---|---|---|
| 1 | S | | | 1 + 0 + 0 = 1 |
| 2 | D | S | | −1 + 3 + 0 = 2 |
| 3 | | S | | 0 + 3 + 0 = 3 |
| 4 | S | S | | 1 + 3 + 0 = 4 |
| 5 | D | D | S | −1 − 3 + 9 = 5 |
| 6 | | D | S | 0 − 3 + 9 = 6 |
| 7 | S | D | S | 1 − 3 + 9 = 7 |
| 8 | D | | S | −1 + 0 + 9 = 8 |
| 9 | | | S | 0 + 0 + 9 = 9 |
| 10 | S | | S | 1 + 0 + 9 = 10 |
| 11 | D | S | S | −1 + 3 + 9 = 11 |
| 12 | | S | S | 0 + 3 + 9 = 12 |
| 13 | S | S | S | 1 + 3 + 9 = 13 |

While this table shows values of delay which are positive, that is, where the strobe is delayed in relation to the data, it is also possible to have values up to negative thirteen, that is, where the strobe precedes the data. This can be done by switching the S and D indicators in the table. Thus, a total range of twenty-seven values of delay are possible using this arrangement. Note that this is an improvement over the FIG. 2 arrangement, which only achieves delay unidirectionally.

Figure 6:
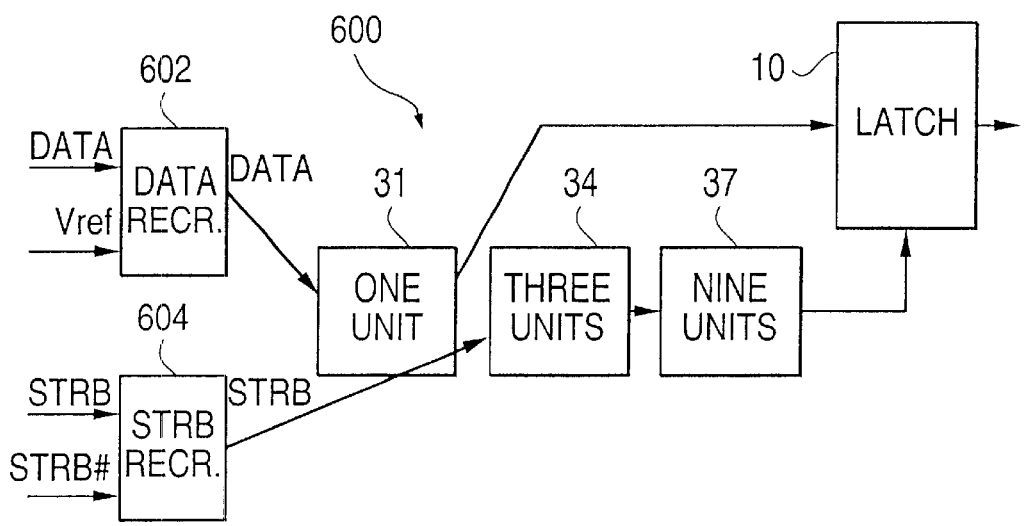
FIG. 6 which illustrates an example where a strobe signal is delayed with respect to a data signal.

To further improve understanding of the above, attention is momentarily directed to FIG. 6 which illustrates an example 600 where a strobe signal is delayed by eleven (11) units of delay with respect to the data. More particularly, a data receiver (Data Recr.) 602 may receive, for example, a data signal as well as a reference voltage Vref, whereas a strobe receiver (Strb Recr) 604 may receive, for example, a strobe signal Strb and an inverted strobe signal Strb#. The Strb signal may be routed to bypass the delay block 31, but through the delay blocks 34 and 37, so as to have a 12 unit delay imposed thereon, whereas the data signal may be routed through the delay block 31, but bypass the delay blocks 34 and 37, so as to have a 1 unit delay imposed thereon. From a perspective of the latch 10, such latch 10 receives the Strb signal delayed by 12 units and the data signal delayed by 1 unit, and accordingly, the Strb signal appears to have a 12−1=11 units of delay with reference to the data signal. Note that in this example, all of the delay blocks 31, 34 and 37 are used by one or the other of the Strb and data signals.

As further discussion of FIG. 3, each delay block 20 may have associated therewith two demultiplexers 32D/32S, 35D/35S, 38D/38S on the input side of the unit, and two multiplexers 32D'/32S', 35D'/35S', 38D'/38S' on the output side of block. The delay and strobe signals are applied to the input demultiplexers of the first block. If the signal is to be delayed, it is sent into the delay block 31, 34 or 37 by the demultiplexer. If it is not to be delayed, it bypasses the delay block. This is determined by one or more control signals (not shown) similar to the control signals shown in FIGS. 1 and 2 that apply appropriate controls to ones of the multiplexers and demultiplexers. Further, although not shown, the FIG. 3 example embodiment may have loadable registers which can be loaded/latched with values via the control signals to appropriately control the individual multiplexers and multiplexers into a fixed state until a reloading of such registers. Whether the signal is passed through the block or bypasses the block, it is applied through the output multiplexer and is then passed to the input multiplexer of the next block. In this way, any combination of the delays can be put together.

By utilizing a ternary system, a savings is first introduced because a ternary system requires fewer blocks to achieve a given range than the binary system. In particular, this permits fewer switches, multiplexers and/or demultiplexers to be used in the system for a given range because of the number of blocks used is reduced. This savings in circuitry saves space on the chip and accordingly is valuable.

In addition, with the FIG. 3 example embodiment, whether a signal is delayed in one or more blocks or not, it still progresses through the same number of multiplexers and demultiplexers as the other signal. This prevents any extraneous asymmetrical delays from being introduced into the signal paths, so that the amount of delay is accurately determined. Building the FIG. 3 (and any other) embodiment with multiplexer pairs and demultiplexer pairs 32D/32S, 35D/35S, 38D/38S, 32D'/32S', 35D'/35S', 38D'/38S', where each member of a respective pair closely match each other in terms of inherent delay, better prevents any extraneous asymmetrical delays from being introduced into the signal paths.

One way to provide closely matched pairs is to manufacture the pairs simultaneously with similar constructions and layouts, with the exact same semiconductor processing operations, and at closely neighboring positions on a semiconductor die. Similar constructions, layouts and processing operations better guarantees closely-matching physical devices, whereas closely neighboring positions better guarantees that each member of the pair is exposed to closely-matching temperatures, voltages, noise, etc., while operative on the semiconductor die. The long/short dashed outline within the FIG. 3 example embodiment is used to representatively show that the FIG. 3 example embodiment may be formed on a same semiconductor integrated circuit (IC) 300.

Continuing discussion, with the FIG. 3 example embodiment, there are no idle multiplexers or demultiplexers used just for delay compensation, but there are always an equal number of active multiplexers in the two paths, which helps jitter compensation. Also, the delay blocks are shared by both the data and strobe signal lines, and so avoiding the need for a full set for each, thus further saving circuitry and chip space.

Figure 4:
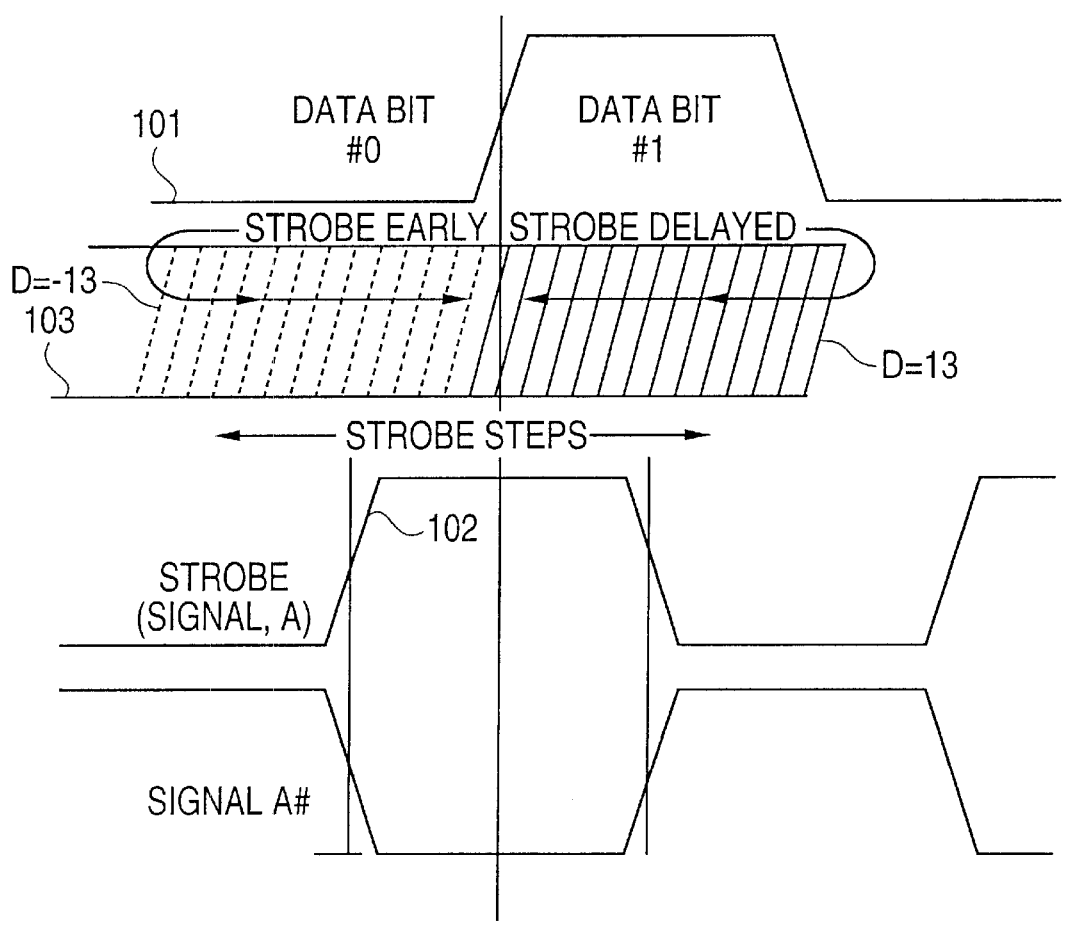
FIG. 4 is a timing diagram of the example advantageous arrangement of FIG. 3.

FIG. 4 shows an example series of timing diagrams which help further describe the system of FIG. 3. Curve 101 shows the data signal changing between a lower and higher level and having a sloped transition edge. Curve 102 shows a strobe signal which is centered on the data edge, and thus which is 90° out of phase with the data signal. Practice of embodiments of the present invention are not limited thereto, in that other types of strobe signals also can be used, such as a coincident strobe, where the edge of the strobe is at the same point as the data edge. Curve 103 shows an enlarged view of a strobe signal having a transition edge delayed to show different example delay positions relative to the data signal. Thus, the central transition is where there is no delay (D=0) in the strobe signal. The (dashed-line) series of transitions to the left indicates where the data signal is delayed, and thus, the strobe is early. The (solid-line) series of transitions to the right indicates where the strobe signal is delayed. As the absolute value of the relative delay increases, the transition moves farther from the center point.

Thus, for a testing system, it is possible to start with an extreme delay amount and slowly change the delay in a series of steps while testing the latching of the data signal for each step, so as to determine the range of delay values for which the latch will correctly receive and hold the data signal. This determines the characteristics of the chip, and may provide sufficient testing to satisfy customers' needs.

Although this system has been shown in terms of hardware, it might also be possible to utilize a software configuration. Thus, in software design, the scheme can be used as an algorithm for an economical means of generating sets of numbers with limited predefined quantities.

FIG. 5 illustrates an example system 500 including a variable stepping arrangement 504 of the present invention. More particularly, such system may, for example, be an IC tester setup 502 which includes the aforementioned variable delay as the variable stepping arrangement, and which may further include a power supply 506 arrangement which is operative to provide power to the entire system (e.g., a battery, electronic power supply, etc), an indicator 508 (e.g., display, indicator lamps, etc), and/or a system memory 510 (e.g., a DRAM).

The system described has been utilized to provide a variable delay in a system used in testing set-up and hold times of a latch. However, embodiments of the present invention also may be used in other situations where variable delay is required. Further embodiments may be applicable in situations where a variable which is stepped is other than time, with a non-exhaustive listing including voltages, currents, resistances, capacitances, inductances, lengths or masses. One example of this is where the ternary base system may be used to provide steps in A/D and D/A converters. Another example is where combinations of ternary stepped voltages are applied to an opposing voltage and ground lines so as to get a desired impressed voltage across such lines. For example, the FIG. 5 system 500 may instead be an electronic apparatus (e.g., processing system, communication apparatus, etc.) which uses the variable delay 504 to control the stepped voltages of power supply 506 (which supplies power levels to the entire system). In short, any application which can utilize this combination of adding and subtracting based on ternary values is within the scope of this invention.

Finally, in some instances like the above-described delay example embodiment, it makes most sense to provide the individual block stages in series, while in other instances, it may make more sense to provide the individual block stages in parallel.

In concluding, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Furthermore, for ease of understanding, certain method procedures may have been delineated as separate procedures; however, these separately delineated procedures should not be construed as necessarily order dependent in their performance, i.e., some procedures may be able to be performed in an alternative ordering, simultaneously, etc.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

What is claimed is:

1. A parameter-stepping circuit comprising:
   a plurality of blocks having parameter values which differ from one another according to powers of three, each block selectably connectable to apply its parameter value to a first circuit branch and a second circuit branch.

2. A parameter-stepping circuit according to claim 1, where each block of the plurality of blocks is selectably connectable to any of at least three states selected from a list of:
   apply its parameter value to neither the first circuit branch nor the second circuit branch;
   apply its parameter value to the first circuit branch, but not the second circuit branch; and
   apply its parameter value to the second circuit branch, but not the first circuit branch.

3. A parameter-stepping circuit according to claim 2, further comprising a control circuit to control selection of the plurality of blocks.

4. A parameter-stepping circuit according to claim 1, each block having associated therewith:
   a first switching arrangement selectable to any of at least two states selected from a list of:
     to apply the block's parameter value to the first circuit branch; and
     to bypass the first circuit branch so as not to apply the block's parameter value to the first circuit branch; and
   a second switching arrangement selectable to any of at least two states selected from a list of:
     to apply the block's parameter value to the second circuit branch; and
     to bypass the second circuit branch so as not to apply the block's parameter value to the second circuit branch.

5. A parameter-stepping circuit according to claim 4, where at least one of the first switching arrangement and the second switching arrangement comprise a multiplexer and a demultiplexer.

6. A parameter-stepping circuit according to claim 1, where a parameter value of each block of the plurality of blocks is mutually different from one another.

7. A parameter-stepping circuit according to claim 1, where the parameter values are delay values.

8. A parameter-stepping circuit according to claim 1, where the plurality of blocks are provided substantially in series with respect to one another.

9. A parameter-stepping circuit according to claim 1, where the plurality of blocks are provided substantially in parallel with respect to one another.

10. A delay circuit comprising:
    a plurality of blocks having delay values which differ from one another according to powers of three, each block selectably connectable to apply its delay value to a first circuit branch and a second circuit branch.

11. A delay circuit according to claim 10, where each block of the plurality of blocks is selectably connectable to any of at least three states selected from a list of:
    apply its delay value to neither the first circuit branch nor the second circuit branch;
    apply its delay value to the first circuit branch, but not the second circuit branch; and
    apply its delay value to the second circuit branch, but not the first circuit branch.

12. A delay circuit according to claim 11, further comprising a control circuit to control selection of the plurality of blocks.

13. A delay circuit according to claim 10, each block having associated therewith:
    a first switching arrangement selectable to any of at least two states selected from a list of:
      to apply the block's delay value to the first circuit branch; and
      to bypass the first circuit branch so as not to apply the block's delay value to the first circuit branch; and
    a second switching arrangement selectable to any of at least two states selected from a list of:
      to apply the block's delay value to the second circuit branch; and
      to bypass the second circuit branch so as not to apply the block's delay value to the second circuit branch.

14. A delay circuit according to claim 13, where at least one of the first switching arrangement and the second switching arrangement comprise a multiplexer and a demultiplexer.

15. A delay circuit according to claim 10, where a delay value of each block of the plurality of blocks is mutually different from one another.

16. A delay circuit according to claim 10, where the plurality of blocks are provided substantially in series with respect to one another.

17. A delay circuit according to claim 10, where the first branch is a data signal branch, and the second branch is a strobe signal branch, the delay circuit further comprising a capture latch to capture outputs of a data signal with respect to a strobe signal.

18. A parameter-stepping method comprising:
    providing a plurality of blocks having parameter values which differ from one another according to powers of three, each block selectably connectable to apply its parameter value to a first circuit branch and a second circuit branch; and,
    selectably connecting ones of the blocks to ones of the first circuit branch and the second circuit branch.

19. A parameter-stepping method according to claim 18, where each block of the plurality of blocks is selectably connectable to any of at least three states selected from a list of:
    apply its parameter value to neither the first circuit branch nor the second circuit branch;
    apply its parameter value to the first circuit branch, but not the second circuit branch; and
    apply its parameter value to the second circuit branch, but not the first circuit branch.

20. A parameter-stepping method according to claim 19, further comprising:
    using a control circuit to control selection of the plurality of blocks.

21. A parameter-stepping method according to claim 18, each block having associated therewith:
    a first switching arrangement selectable to any of at least two states selected from a list of:
      to apply the block's parameter value to the first circuit branch; and
      to bypass the first circuit branch so as not to apply the block's parameter value to the first circuit branch; and a second switching arrangement selectable to any of at least two states selected from a list of:
  to apply the block's parameter value to the second circuit branch; and
  to bypass the second circuit branch so as not to apply the block's parameter value to the second circuit branch.

22. A parameter-stepping method according to claim 21, where at least one of the first switching arrangement and the second switching arrangement comprise a multiplexer and a demultiplexer, and the selectably connecting step includes using the multiplexer and the demultiplexer to selectably connect ones of the blocks to ones of the first circuit branch and the second circuit branch.

23. A parameter-stepping method according to claim 18, where a parameter value of each block of the plurality of blocks is mutually different from one another.

24. A parameter-stepping method according to claim 18, where the parameter values are delay values.

25. A parameter-stepping method according to claim 24, where a delay value of at least one block of the plurality of blocks is applied to a first input signal, and a delay value of a differing at least one block is applied to a second input signal, the method further comprising:
  capturing an output of the first input signal with respect to an output of the second input signal, where a relative delay between output signals is a difference between delay of the at least one block and the delay of the differing at least one block.

26. A parameter-stepping method according to claim 25, where the first input signal is a data signal, and the second input signal is a strobe signal.

27. A parameter-stepping method according to claim 18, where the plurality of blocks are provided substantially in series with respect to one another.

28. A parameter-stepping method according to claim 18, where the plurality of blocks are provided substantially in parallel with respect to one another.

29. A system comprising:
  at least one of an input device and output device;
  a power supply operative to supply power throughout the system; and
  a parameter-stepping circuit including:
    a plurality of blocks having parameter values which differ from one another according to powers of three, each block selectably connectable to apply its parameter value to a first circuit branch and a second circuit branch.

30. A system according to claim 29, where each block of the plurality of blocks is selectably connectable to any of at least three states selected from a list of: apply its parameter value to neither the first circuit branch nor the second circuit branch; apply its parameter value to the first circuit branch, but not the second circuit branch; and, apply its parameter value to the second circuit branch, but not the first circuit branch.

31. A system according to claim 29, each block having associated therewith:
  a first switching arrangement selectable to any of at least two states selected from a list of:
    to apply the block's parameter value to the first circuit branch; and
    to bypass the first circuit branch so as not to apply the block's parameter value to the first circuit branch; and
  a second switching arrangement selectable to any of at least two states selected from a list of:
    to apply the block's parameter value to the second circuit branch; and
    to bypass the second circuit branch so as not to apply the block's parameter value to the second circuit branch.

32. A system according to claim 31, where at least one of the first switching arrangement and the second switching arrangement comprise a multiplexer and a demultiplexer.

33. A system according to claim 29, where the parameter values are delay values, and the parameter-stepping circuit is part of a signal delay testing circuit.

* * * * *